(12) United States Patent
Murakami

(10) Patent No.: US 6,354,199 B2
(45) Date of Patent: Mar. 12, 2002

(54) SCREEN PRINTING METHOD AND HOLDING TABLE FOR PLATE TO BE PRINTED

(75) Inventor: Takehiko Murakami, Inagi (JP)

(73) Assignee: Minami Co., Ltd., Tokyo (JP)

( * ) Notice: Subject to any disclaimer, the term of this patent is extended or adjusted under 35 U.S.C. 154(b) by 0 days.

(21) Appl. No.: 09/852,759

(22) Filed: May 11, 2001

Related U.S. Application Data

(62) Division of application No. 09/251,347, filed on Feb. 17, 1999, now Pat. No. 6,253,676.

(30) Foreign Application Priority Data

Mar. 26, 1998 (JP) .............................................. 10-98360

(51) Int. Cl.[7] .............................................. B05C 17/06
(52) U.S. Cl. ...................................... 101/126; 101/123
(58) Field of Search ................................ 101/114, 123, 101/124, 126, 129

(56) References Cited

U.S. PATENT DOCUMENTS 4,520,726 A * 6/1985 Rouly et al. ................. 101/123
4,696,228 A * 9/1987 David et al. ................. 101/123
4,854,229 A * 8/1989 Vassiliou ..................... 101/123

* cited by examiner

*Primary Examiner*—Ren Yan
(74) *Attorney, Agent, or Firm*—Nath & Associates PLLC; Harold L. Novick

(57) ABSTRACT

A holding table for a plate to be printed, has a table plate with a supporting body on an end; a holding plate pivotally attached to an upper end of the supporting body; a moving table slidably mounted on guide rails secured to the table plate; a link pivotally connected to a free end of the holding plate and pivotally connected to the moving table. A driving plate fixed to the moving table has an opening with an internal thread. A driving motor on the table plate has an output shaft with a screw shaft engaged with the internal thread. Upon applying a printing agent to the plate to be printed by a movement of a squeegee, the plate to be printed is gradually separated from a screen from one side to another such that the printing agent within a through hole in the screen is smoothly and completely released.

4 Claims, 3 Drawing Sheets

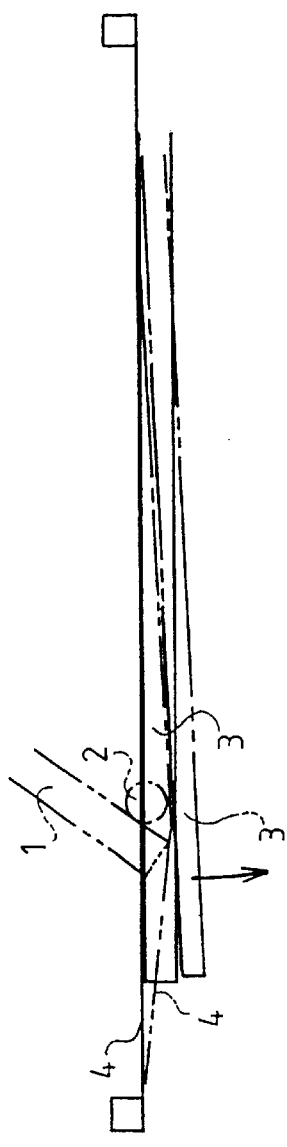
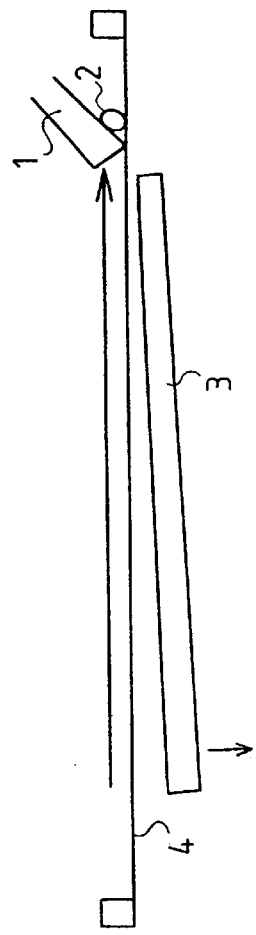
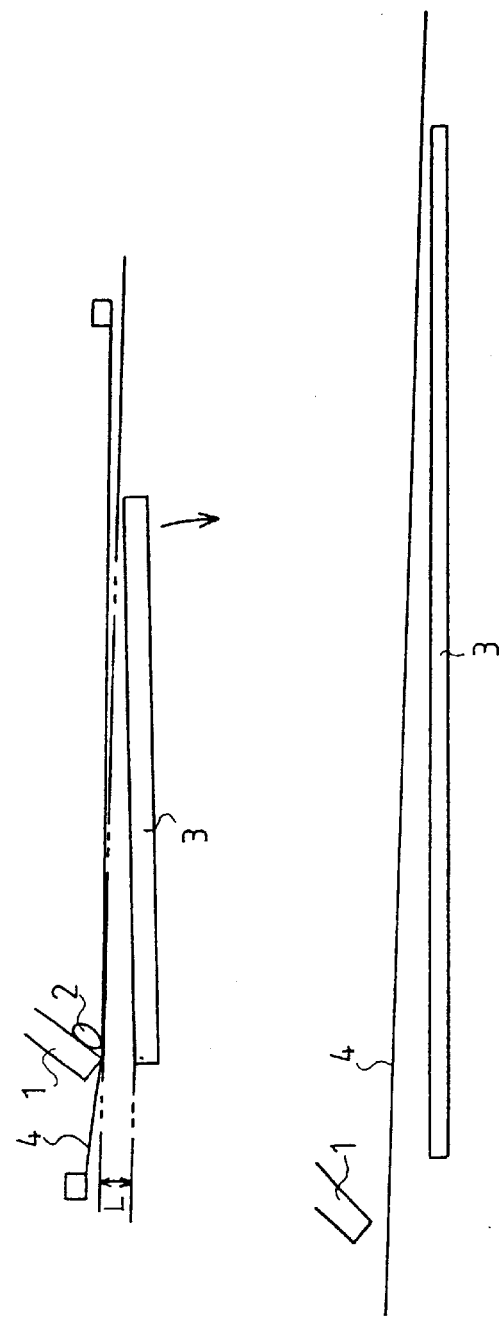
FIG. 1
FIG. 2
FIG. 3
FIG. 4

SCREEN PRINTING METHOD AND HOLDING TABLE FOR PLATE TO BE PRINTED

This application is a divisional application of U.S. patent application Ser. No. 09/251,347, filed Feb. 17, 1999, now U.S. Pat. No. 6,253,676, the entire contents of which are hereby incorporated by reference in the entirety.

BACKGROUND OF THE INVENTION

1. Field of the Invention

The present invention relates to a screen printing method and a holding table for a plate to be printed used for the method.

2. Description of the Prior Art

A screen printing is so structured as to move a squeegee in a state of bringing a screen into contact with an upper surface of a plate to be printed such as a printed plate board and the like or setting the screen slightly apart therefrom and apply a printing agent such as a creamed solder and the like to the plate to be printed, thereby performing a printing.

Further, during the process, the screen is separated from the plate to be printed after applying the printing agent. In this case, the screen is conventionally wholly lifted up to an immediately upper direction and all the surface is separated simultaneously from the plate to be coated.

However, when all the surface is simultaneously separated as mentioned above, there is a case that the printing agent within a through hole of the screen is left within the through hole without being released out over the printed plate board, especially at the moment the screen is separated at a center portion thereof, depending upon a degree of a viscosity of the printing agent. In this case, an uneven coating of the printing agent on the plate to be printed is generated, so that a problem that a lack of pattern is generated. For this reason, in order to peel off the uneven printing agent conventionally, a peeling operation is performed for ten and some minutes.

Therefore, a lot of producing time is required by the time of completion, and this greatly causes to increase a cost of a product.

SUMMARY OF THE INVENTION

The present invention is made by taking the points mentioned above into consideration, and an object of the present invention is to provide a screen printing method structured so that a printing agent within a through hole of a screen may smoothly and completely release out when separating the screen from a plate to be printed, thereby preventing a uneven coating of the printing agent from generating.

Another object of the present invention is to provide a screen printing method structured so as to move a squeegee with a proper interval between a screen and a plate to be printed, in which a printing can be performed by keeping the same interval from the first to the last printing operation.

Still further, the other object of the present invention is to provide a holding table for a plate to be printed which is so structured as to efficiently perform the screen printing method mentioned above.

In accordance with a first aspect of the present invention, there is provided a screen printing method, in which at a time of applying a printing agent to a plate to be printed by a movement of a squeegee, the plate to be printed is gradually separated from said screen and from one side of the screen to the other side thereof step by step during a movement of the squeegee to a movement finishing end.

Further, in accordance with a second aspect of the present invention, there is provided a screen printing method, in which at a time of applying a printing agent to a plate to be printed by a movement of a squeegee, the plate to be printed is gradually separated from said screen and from one side of the screen to the other side thereof step by step after the squeegee reaches a movement finishing end.

Still further, in accordance with a third aspect of the present invention, there is provided a screen printing method which is so structured as to move a squeegee at a proper interval between a screen and a plate to be printed, in which at a time of applying a printing agent to a plate to be printed by a movement of a squeegee, the plate to be printed is set below the screen in an inclined manner so that a movement starting side is most apart, and a movement finishing side of the squeegee of the plate to be printed is gradually descended in correspondence to a moving speed of the squeegee to thereby always keep printing at the same interval.

Furthermore, in accordance with a fourth aspect of the present invention, there is provided a screen printing method which is so structured as to move a squeegee at a proper interval between a screen and a plate to be printed, in which at a time of applying a printing agent to a plate to be printed by a movement of a squeegee, the plate to be printed is set below the screen in an inclined manner so that a movement starting side is most apart, and the plate to be printed is gradually descended while keeping an angle of incline in correspondence to a moving speed of the squeegee to thereby always keep printing at the same interval.

Moreover, the screen printing method in accordance with the first, second and third aspects mentioned above of the prevent invention can be efficiently realized by a holding table for a plate to be printed comprising a supporting body stood on an end on a table plate, a holding plate setting a plate to be printed on a surface thereof, an end of the holding plate being pivotally attached to an upper end of said supporting body in such a manner as to freely incline, and said holding plate being gradually inclined from a horizontal state at a predetermined speed via proper means.

Further, the holding table for the plate to be printed may be made by the following concrete structure. Accordingly, there is provided a holding table for a plate to be printed, comprising a table plate, a supporting body stood on an end on said table plate, a holding plate setting the plate to be printed on an upper surface thereof and having an end pivotally attached to an upper end of said supporting body in such a manner as to freely incline, a link having one end side pivotally connected to a lower surface in a side of a free end of said holding plate and the other end side pivotally connected to a moving table, the moving table mounted in such a manner as to freely move in a direction of attaching to and detaching from said supporting body, a driving plate adhered to said moving table and having a screw with which a screw shaft is engaged, and a reversible driving motor adhered on said table plate and making the screw shaft connected to an axis of rotation thereof to engage with the screw of said driving plate.

BRIEF DESCRIPTION OF THE DRAWINGS

FIG. 1 is a schematic view of a screen printing method in accordance with the present invention;

FIG. 2 is a schematic view of a screen printing method in accordance with the present invention;

FIG. 3 is a schematic view of a screen printing method in accordance with of the present invention;

FIG. 4 is a schematic view of a screen printing method in accordance with the present invention, which shows a state thereof before starting printing;

DESCRIPTION OF THE PREFERRED EMBODIMENT

Figure 5:
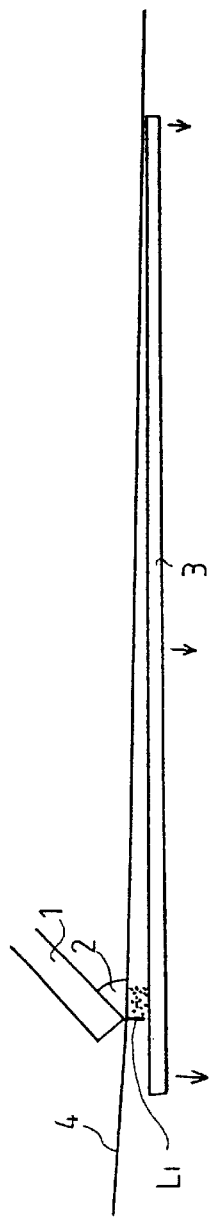
FIG. 5 is a schematic view of the screen printing method in accordance with the present invention, which shows a state at which a squeegee moves and starts applying a printing agent to a plate to be printed.

An embodiment in accordance with the present invention will be described below.

First, a description will be given of an embodiment of a screen printing method of the present invention with reference to FIG. 1. A state shown by a solid line in FIG. 1 corresponds to a state at which a squeegee 1 is moved and a printing agent 2 such as a creamed solder or the like is applied to a plate 3 to be printed such as a printed plate board or the like. In this case, in order to promote an understanding, the other elements in a screen printing machine are omitted.

The present invention is characterized in that the squeegee 1 gradually inclines the plate 3 to be printed at a predetermined speed as shown by an imaginary line during a movement to a movement finishing end so as to gradually separate the plate 3 from one side of a screen 4 to the other side thereof step by step.

Further, an embodiment of a screen printing method is shown in FIG. 2. A difference from the embodiment shown in FIG. 1 is that the plate to be printed is separated from the screen after the squeegee reaches a movement finishing end. In this case, since the other elements are the same as those in FIG. 1, the same reference numerals are used to the same elements, and a description thereof will be omitted.

Still further, FIG. 3 shows an embodiment of a screen printing method which is so structured as to move a squeegee at an interval between a screen and a plate to be printed, which is different from that of FIGS. 1 and 2. In this case, the plate 3 to be printed is set in an inclined manner so that a movement starting side of the squeegee is most apart to thereby gradually descend the movement finishing end of the squeegee in the plate 3 to be printed in correspondence to a moving speed of the squeegee.

Furthermore, FIGS. 4 to 7 show an embodiment of a screen printing method which is so structured as to move a squeegee at an interval between a screen and a plate to be printed, which is different from the printing method shown in FIG. 3. In this method, the plate 3 to be printed is set below the screen 4 in an inclined manner so that a movement starting side of the squeegee 1 is most apart to thereby gradually descend the plate to be printed in correspondence to a moving speed of the squeegee while maintaining an angle of incline.

Figure 6:
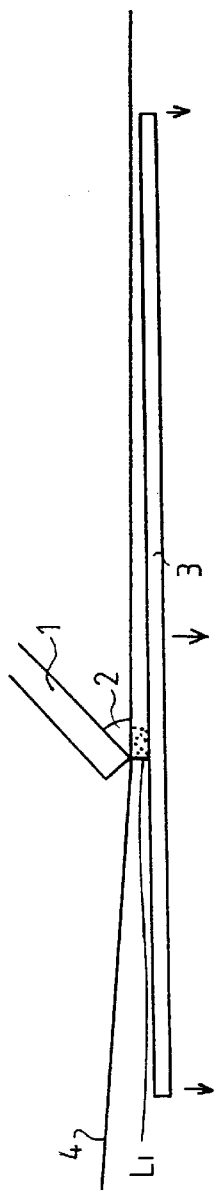
FIG. 6 is a schematic view of the screen printing method in accordance with the present invention, which shows a state at which the squeegee moves in the middle of the plate to be printed.
Figure 7:
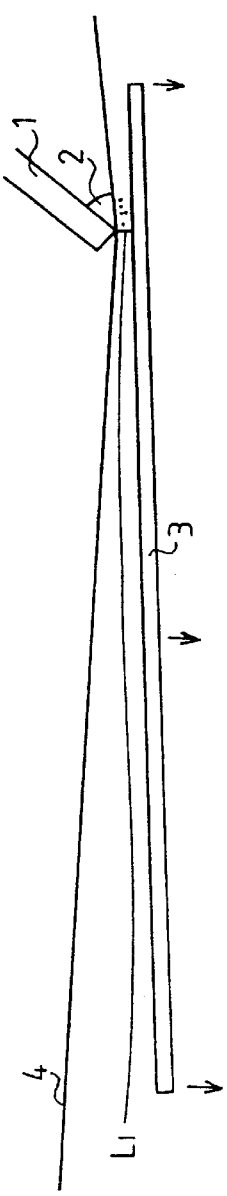
FIG. 7 is a schematic view of the screen printing method in accordance with the present invention, which shows a state at which the squeegee moves near an, end portion of the plate to be printed.

FIG. 4 shows a state before starting a printing, FIG. 5 shows a state that the squeegee 1 moves and starts in applying the printing agent 2 to the plate 3 to be printed, FIG. 6 shows a state that the squeegee 1 moves in the middle of the plate 3 to be printed, and FIG. 7 shows a state that the squeegee 1 moves near an end portion of the plate 3 to be printed.

Second, a description will be given of a holding table for the plate to be printed shown in FIGS. 8 to 11.

In the drawings, reference numeral 5 denotes a holding table for the plate to be printed, which is constituted by the following elements. Further, the holding table 5 for the plate to be printed receives the plate to be printed such as a printed plate board or the like from a conveyor (not shown), ascends the plate to be printed to a position where it comes in contact with a lower surface of the screen and is set on an ascending and descending table (not shown) which descend again after printing.

Reference numeral 6 denotes a rectangular table plate. Reference numerals 7, 7 denote supporting bodies stood on an end of the table plate 6. Reference numeral 8 denotes a holding plate for setting the plate to be printed on an upper surface, in which an end is pivotally attached to an upper end of each of the supporting bodies 7 and 7 in such manner as to freely incline. Reference numerals 9, 9 denote supporting bodies adhered to an end of the holding plate 8, and reference numeral 10 denotes a shaft for pivotally attaching each of the supporting bodies 9 and 9 to the upper end of each of the supporting bodies 7 and 7 in such a manner as to freely incline.

Reference numeral 11 denotes a link, in which an end is pivotally connected to a lower surface on a side of a free end of the holding plate 8 and the other end is pivotally connected to a moving table mentioned below. Reference numeral 12 denotes a member for connecting an end of each of the links 11 and 11 to the free end of the holding plate 8, which is adhered to the lower surface on the side of the free end of the holding plate 8. Reference numeral 13 denotes a shaft for pivotally connecting each of the links 11 and 11 to each of the members 12 and 12. Reference numeral 14 denotes a shaft for pivotally connecting the other end of each of the links 11 and 11 to the moving table.

Reference numeral 15 denotes a guide rail, and the guide rails 15 and 15 are provided on the table plate 6 in a parallel manner. Further, the guide rails 15 and 15 are provided on a side opposite to the supporting bodies 7 and 7. Reference numeral 16 denotes a moving table mounted to each of the guide rails 15 and 15, which is structured so as to freely move in a direction of attaching to and detaching from the supporting body 7.

Reference numeral 17 denotes a driving plate extending between the moving tables 16 and 16 and adhered thereto, which is provided with a screw (not shown) engaging with a screw shaft mentioned below at a middle portion in a longitudinal direction. Reference numeral 18 denotes a reversible driving motor adhered on the table plate 6, in which a servo motor is used in the present embodiment. Further, a screw shaft 19 is connected to an axis of rotation of the driving motor 18, and the screw shaft 19 is engaged with the screw provided in the driving plate 17.

Then, the holding table 5 for the plate to be printed is operated in the following manner.

Figure 8:
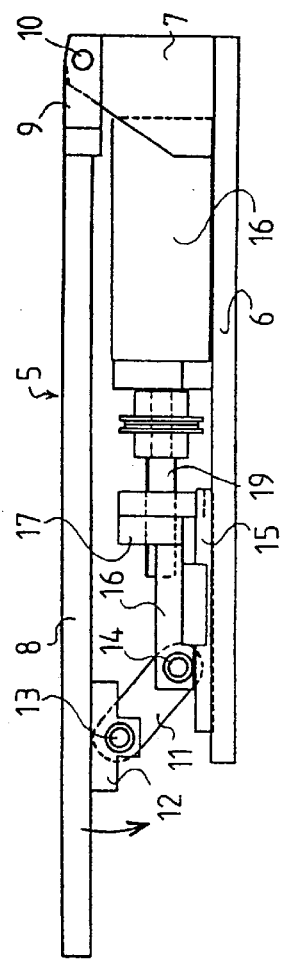
FIG. 8 is a front elevational view of a holding table of the plate to be printed in accordance with the present invention.
Figure 9:
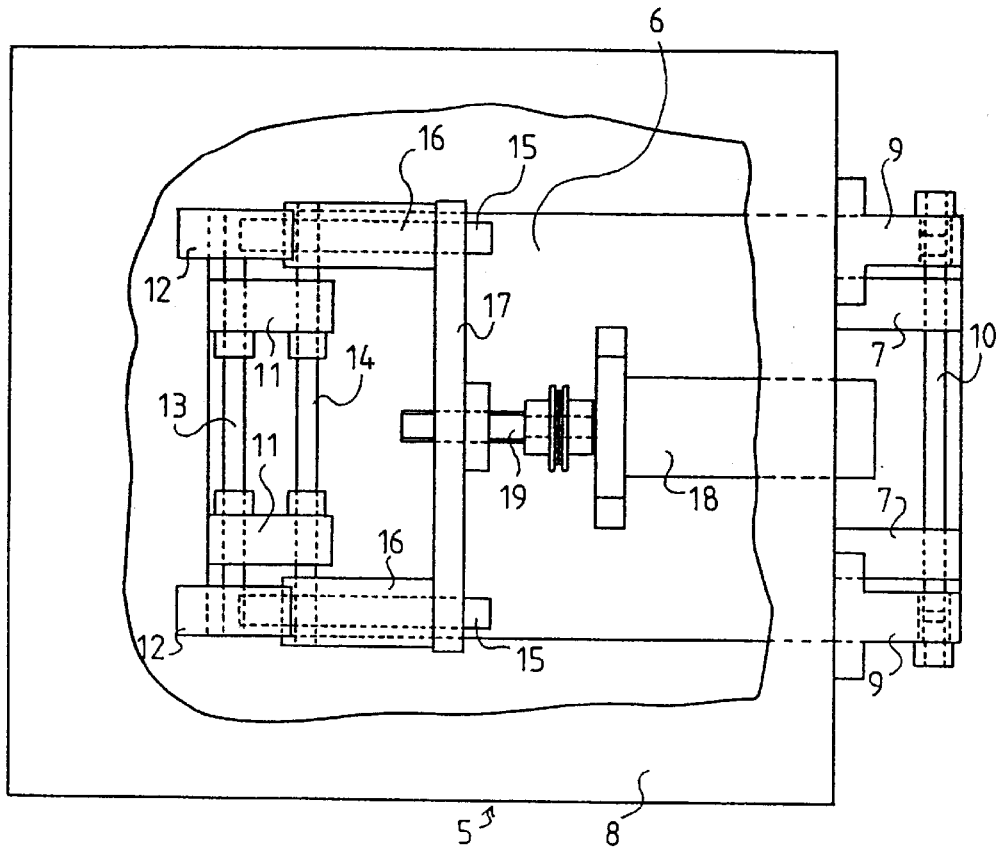
FIG. 9 is a plan view of a holding table of the plate to be printed in accordance with the present invention.
Figure 10:
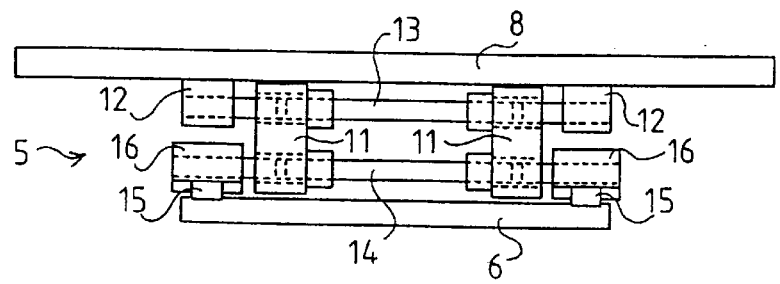
FIG. 10 is a left side elevational view of a holding table of the plate to be printed in accordance with the present invention.
Figure 11:
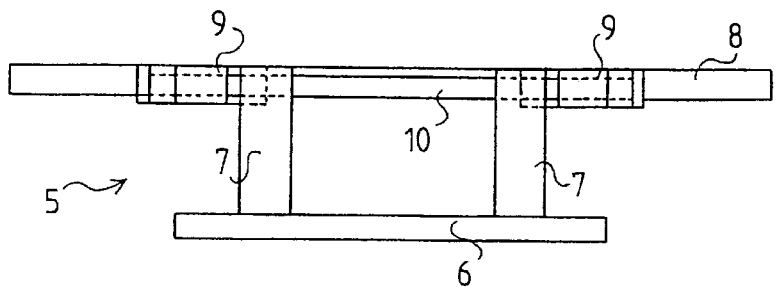
FIG. 11 is a right side elevational view of a holding table of the plate to be printed in accordance with the present invention.

In the case of printing in accordance with the printing method shown in FIGS. 1 and 2, the holding plate 8 is positioned in a horizontal manner as shown in FIG. 8. When the printing agent is applied to the plate to be printed by a movement of the squeegee, the driving motor 18 is operated. In this case, the operation of the driving motor 18 may be performed after the printing is completely applied to all the surface of the plate to be printed, or may be performed immediately after the squeegee passes in the middle of the printing and performs an application, thereby starting an peeling operation.

When the driving motor 18 is operated, the holding plate 8 starts in inclining around the shaft 10 as a supporting point. In this case, when the driving motor 18 is operated, the screw shaft 19 is rotated, and the moving table 16 is moved via the driving plate 17. Then, the holding plate 8 is inclined via the link 11 in accordance with a movement of the moving table 16. Inclining of the holding plate 8 is slowly performed, and the rotational speed of the driving motor 18 is adjusted so that the holding plate 8 is inclined at a proper speed in correspondence to a viscosity of the printing agent or the like.

When the holding plate 8 is inclined, the plate to be printed set on the upper surface of the holding plate 8 is gradually separated off the screen from a side of the screen to the other side step by step. When the plate to be printed is separated in the manner mentioned above, the plate to be printed is slowly peeled off by a uniform force and the screen is separated while being obliquely bent, so that the printing agent within the through hole of the screen can be easily released from the through hole.

When the squeegee reaches the movement finishing end and the printing is completed, the ascending and descending table is dropped down. At this time, the driving motor 18 is reversely rotated so as to return the holding plate 8 to a horizontal state again. When the ascending and descending table is dropped down so as to release the plate to be printed in the printing agent and the next plate to be printed is set, the ascending and descending table is again lifted up so as to perform a printing. Then, the operation mentioned above is performed thereafter.

In accordance with the methods of the present invention, the printing agent within the through hole of the screen can be smoothly and completely released out when separating the screen from the plate to be printed. Accordingly, it is possible to prevent a uneven coating of the printing agent from generating.

Further, the screen printing method is so structured as to move the squeegee with an interval between the screen and the plate to be printed, a printing can be performed in a state of keeping the same interval (a length L in FIG. 3 and a length $L_1$ in FIGS. 5 to 7) from the beginning to end. Accordingly, it is preferable to a printing of a special printing agent other than the creamed solder, and further it is possible to print a required necessary amount, still further, a large number of printings can be performed without soiling a back surface of the screen.

Particularly, in accordance with the methods of the present invention, more significant effect can be obtained in the case of printing a pattern having a high density and in the case of using a thin screen.

Further, in accordance with the holding table for the plate to be printed of the present invention, it is possible to efficiently perform the method mentioned above.

What is claimed is:

1. A holding table for a plate to be printed, comprising a table plate, a supporting body stood on an end on said table plate, a holding plate setting the plate to be printed on an upper surface thereof and having an end pivotally attached to an upper end of said supporting body in such a manner as to freely incline, a link having one end side pivotally connected to a lower surface on a side of a free end of said holding plate and the other end side pivotally connected to a moving table, the moving table mounted in such a manner as to freely move in a direction of attaching to and detaching from said supporting body, a driving plate adhered to said moving table and having a screw with which a screw shaft is engaged, and a reversible driving motor adhered on said table plate and making the screw shaft connected to an axis of rotation thereof to engage with the screw of said driving plate.

2. A holding table for a plate to be printed, as claimed in claim 1, wherein said moving table is slidably mounted on guide rails secured to said table plate so that said moving table can move in a direction toward and away from said supporting body.

3. A holding table for a plate to be printed, as claimed in claim 1, wherein said driving plate is provided with an opening with an internal thread.

4. A holding table for a plate to be printed, as claimed in claim 3, wherein said driving motor further comprises an output shaft with a screw shaft connected thereto, said screw shaft engaged with said internal thread in said opening of said driving plate.

* * * * *